United States Patent [19]

Wang et al.

[11] Patent Number: 6,162,699
[45] Date of Patent: Dec. 19, 2000

[54] METHOD FOR GENERATING LIMITED ISOLATION TRENCH WIDTH STRUCTURES AND A DEVICE HAVING A NARROW ISOLATION TRENCH SURROUNDING ITS PERIPHERY

[75] Inventors: Larry Wang, San Jose; Nick Kepler, Saratoga; Olov Karlsson, San Jose, all of Calif.; Basab Bandyopadhyay, Austin, Tex.; Effiong Ibok, Sunnyvale; Christopher F. Lyons, Fremont, both of Calif.

[73] Assignee: Advanced Micro Devices, Inc., Sunnyvale, Calif.

[21] Appl. No.: 09/181,561

[22] Filed: Oct. 29, 1998

[51] Int. Cl.[7] .................................................. H01L 21/76
[52] U.S. Cl. ......................... 438/404; 438/942; 438/945; 257/506
[58] Field of Search .................................... 438/692, 404, 438/405, 410, 942, 943, 944, 945, 946, 947, 618

[56] References Cited

U.S. PATENT DOCUMENTS

| | | | |
|---|---|---|---|
| 4,753,901 | 6/1988 | Ellsworth et al. | 437/67 |
| 5,734,192 | 3/1998 | Sengle et al. | 257/506 |
| 5,742,090 | 4/1998 | Stolmeijer et al. | . |
| 5,877,066 | 3/1999 | Stolmeijer et al. | 438/424 |
| 5,888,894 | 3/1999 | Kong et al. | 438/618 |
| 5,948,573 | 9/1999 | Takahashi | 430/5 |
| 5,958,795 | 9/1999 | Chen et al. | 438/692 |

*Primary Examiner*—John F. Niebling
*Assistant Examiner*—Viktor Simkovic

[57] ABSTRACT

A method for effectively generating limited trench width isolation structures without incurring the susceptibility to dishing problems to produce high quality ICs employs a computer to generate data representing a trench isolation mask capable of being used to etch a limited trench width isolation structure about the perimeter of active region layers, polygate layers, and Local Interconnect (LI) layers. Once the various layers are defined using data on the computer and configured such that chip real estate is maximized, then the boundaries are combined using, for example, logical OR operators to produce data representing an overall composite layer. Once the data representing the composite layer is determined, the data is expanded evenly outward in all horizontal directions by a predetermined amount, $\lambda$, to produce data representing a preliminary expanded region. Any narrow regions are then merged together with the preliminary expanded region to produce data representing a final expanded region, which is used to produce a mask employed to produce an even width trench about the perimeter of the composite layer. The computer then generates the mask according to the results achieved and the isolation trenches are etched. The resulting isolation trenches prevent short-circuits from occurring between the various electrical devices on the semiconductor device.

16 Claims, 9 Drawing Sheets

METHOD FOR GENERATING LIMITED ISOLATION TRENCH WIDTH STRUCTURES AND A DEVICE HAVING A NARROW ISOLATION TRENCH SURROUNDING ITS PERIPHERY

FIELD OF THE INVENTION

The present invention relates to a method of manufacturing integrated circuit devices, and more particularly, to a method for effectively producing limiting trench width isolation structures to produce high quality integrated circuits.

BACKGROUND ART

Implementing electric circuits involves connecting isolated circuit components or devices through specific electrical paths. When fabricating integrated circuits into a semiconductor substrate, it is necessary to electrically isolate devices within the substrate from other devices within the substrate. The devices are subsequently interconnected to create specific desired circuit configurations.

Typically the first several steps in semiconductor device processing involve dividing the wafer into active regions, or source/drain regions, where transistors will be formed and field regions that isolate adjacent active areas. In general, semiconductor devices, or integrated circuits (ICs), have utilized either trench isolation or selective oxidation such as local oxidation of silicon (LOCOS) to electrically insulate or isolate various portions of the semiconductor device from other portions of the device. Trench isolation typically involves etching a recess or trench in the silicon (Si) substrate, filling the trench with an insulation material such as silicon oxide by using, for example, tetraethylorthosilicate (TEOS), and planarizing the insulation material. LOCOS techniques typically involve growing a pad or liner oxide on a Si substrate, depositing a nitride film, patterning and etching the nitride film and then growing or forming an oxide and heating the substrate so that the exposed portions of the oxide grow to form an insulating medium in the semiconductor device.

The isolation regions for semiconductor devices vary in size depending on parameters or requirements necessary for proper electrical isolation and charge carrier isolation in the device. For example, in complementary metal oxide semiconductor (CMOS) devices including integrated circuits (ICs) such as logic and memory components, both wide isolation regions and narrow isolation regions are necessary on the Si substrate to effectively isolate certain areas of the semiconductor chip or device. Certain areas of the semiconductor chip require large isolation regions while others require small isolation regions due to different voltage requirements, dopant types, increased circuit packing density, dopant concentrations, or other criteria associated with IC design.

As various semiconductor devices or ICs have become smaller, the demands for the efficient use of space by isolation regions has increased. The use of trench isolation regions has helped satisfy these demands due to their relatively small size. However, trench isolation regions are susceptible to unevenness or "dishing" when the trench isolation regions are planarized. Dishing is a particular problem when wide and narrow isolation regions are employed in the semiconductor device because the insulating material (e.g., TEOS) tends to be removed from the wide isolation regions more quickly than from the narrow isolation regions. Conventional LOCOS techniques can be disadvantageous because they require relatively large lateral spacing on the semiconductor substrate.

A conventional method of trench isolation formation is depicted in FIGS. 1A–1H. A pad oxide layer 111 is thermally grown on the surface of a silicon substrate 110 having well regions 130 and 140 as depicted in FIG. 1A. Next, a layer of silicon nitride 112 is deposited by chemical vapor deposition (CVD) on top of the pad oxide layer 111 as depicted in FIG. 1B. A photo-resist mask layer 115 depicted in FIG. 1C is then deposited and patterned on top of the nitride layer 112. A dry etch is performed to etch nitride, oxide and to form Si trenches in the open regions 114, as depicted by 161–163 in FIG. 1D after the resist 115 is removed.

After the trench formation, an oxide layer 150 of a thickness H, where H is greater than the thickness of the nitride layer 112 plus the thickness of the pad oxide layer 111 plus the height of the trench 162, is deposited by CVD above the remaining portions of the nitride layer 112 and the trenches 161–163. Basically, the main criteria is to make sure that the level of the CVD oxide layer 150 is above the level of the nitride layer 112, as depicted in FIG. 1E.

The step of depositing the CVD oxide layer 150 is followed by a planarization technique. Planarization is carried out by the use of a planarization mask 151 as depicted in FIG. 1F. After the planarization mask 151 is applied, the CVD oxide layer 150 is etched and the planarization mask 151 is removed. The resulting structure is illustrated in FIG. 1G. The structure of FIG. 1G is then polished to yield the structure of FIG. 1H, which shows that the level of the oxide 150 at the center portions of the trenches 161–163 are lower in height than at the edge portions of the trenches 161–163. This phenomenon is known in the art as "dishing" and adversely affects the planarity of the IC.

It has been demonstrated that by limiting the width of the isolation trenches separating active regions, the dishing effect can be minimized. For example, U.S. Pat. No. 5,742,090, issued on Apr. 21, 1998, to André Stolmeijer et al describes such an IC. FIGS. 2A–2E illustrate the steps of preparing the isolation structure according to the invention described in Stolmeijer et al. A pad oxide layer 11 is thermally grown on the surface of a silicon substrate 10 having well regions 30 and 40 as depicted in FIG. 2A. Next, a layer of CVD silicon nitride 12 is deposited on top of the pad oxide layer 11 as depicted in FIG. 2B. A photo-resist mask layer (not shown) is then deposited on top of the nitride layer 12 and the region of the nitride layer 12 exposed through the mask layer is anistropically dry etched to produce etched openings 14 (preferably all of equal limited width) through the nitride layer 12 (see FIG. 2C). The etched openings define regions that are subsequently etched to form isolation trenches 71–75 illustrated in FIG. 2D. The etched openings 14 are controlled to be preferably less than or equal to about 0.5 μm. Alternatively, trenches can be formed by etching nitride, oxide and forming an Si trench without relying on nitride as an etch mask.

After the trench formation, an oxide layer is deposited above the remaining portions of the nitride layer 12 and the trenches 71–75, and is polished until the entire upper surface of the remaining portions of the nitride is exposed. The resulting structure after the step of polishing is illustrated in FIG. 2E, which shows that because of the limited width of the trenches 71–75, the level of the oxide in the center portions of the trenches 71–75 are substantially the same as the level of the oxide at the edge portions of the trenches 71–75. In other words, dishing has been minimized. The use of limited width isolation trenches completely eliminates the costly steps of using a planarization mask, etching the CVD oxide layer, and removing the planarization mask.

The use of limited width isolation trenches provides a cost-effective way to electrically isolate devices within the substrate from other devices within the substrate. However, as ICs become smaller and more complex the concern becomes how to effectively generate a mask needed to create such narrow isolation trenches. The patent to Stolmeijer et al. did not account for field poly connection and local interconnect (LI) where isolations are needed. Thus there is a need for a method for effectively generating limited trench width isolation structures to satisfy isolation requirement of more complex layout situations. There is also a need for a method of fabricating a semiconductor device having isolation regions formed by a space efficient process that is not susceptible to dishing problems.

SUMMARY OF THE INVENTION

The present invention advantageously provides a method for effectively generating limited trench width isolation structures to produce high quality ICs. The fabrication technique utilizes the advantages of trench isolation without incurring the susceptibility to dishing problems. The technique is capable of quickly and simply producing small, complex ICs having active areas or devices surrounded by isolation structures.

According to the present invention, the foregoing and other needs are met by a method of manufacturing semiconductor devices using a computer to generate a trench isolation mask about the perimeter of active region layers, polygate layers, and Local Interconnect (LI) layers. Once data representing the layers is generated on the computer and configured such that chip real estate is maximized, then the data representing the various layers are combined to defme data representing a composite layer, using, for example, OR logic operators. Once data representing the composite layer is determined, then the composite layer is expanded evenly outward in all horizontal directions by a predetermined amount, $\lambda$, to produce data representing a preliminary expanded region. Any narrow regions are then merged together with the preliminary expanded region to produce data representing a final expanded region, which can be used to produce a mask capable of producing an even width trench about the perimeter of the composite layer. The computer then generates the mask according to the results achieved and the isolation trenches are etched. The resulting isolation trenches prevent short-circuits from occurring between the various electrical devices on the semiconductor device.

Additional advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

DETAILED DESCRIPTION OF THE INVENTION

The present invention addresses and solves the dishing problem, illustrated in FIGS. 1A–1H, by effectively producing narrow isolation trenches as depicted in FIGS. 2A–2E. The present invention is concerned with the step in the semiconductor manufacturing process depicted in FIG. 2C. This step involves depositing a photo-resist mask layer (not shown) on top of the nitride layer 12.

The present invention is related to a method of manufacturing a semiconductor structure including a semiconductor substrate having a pad oxide layer formed over the substrate, and a nitride layer formed over the pad oxide layer. The present invention uses a computer to generate data representing a trench isolation mask capable of being used to produce a limited trench width structure about the perimeter of an active layer on the semiconductor structure. The present invention uses a set of rules to ultimately construct a trench having a width no larger than a predetermined distance. Limiting the trench width allows direct polish planarization without the use of an expensive reverse planarization mask and etch. The limited width isolation trench constructed using the present invention does not compromise circuit performance by added capacitance. It will also eliminate the oxide dishing problems mentioned above.

Figure 1A:
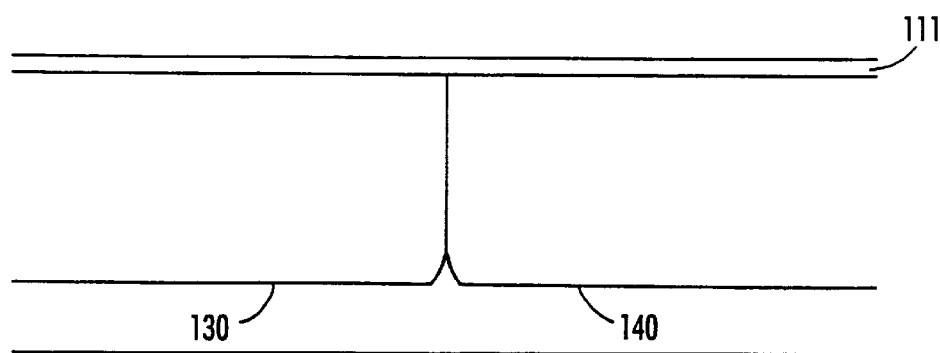
FIGS. 1A–1H illustrate how dishing occurs using a conventional method with a planarization mask.
Figure 1B:
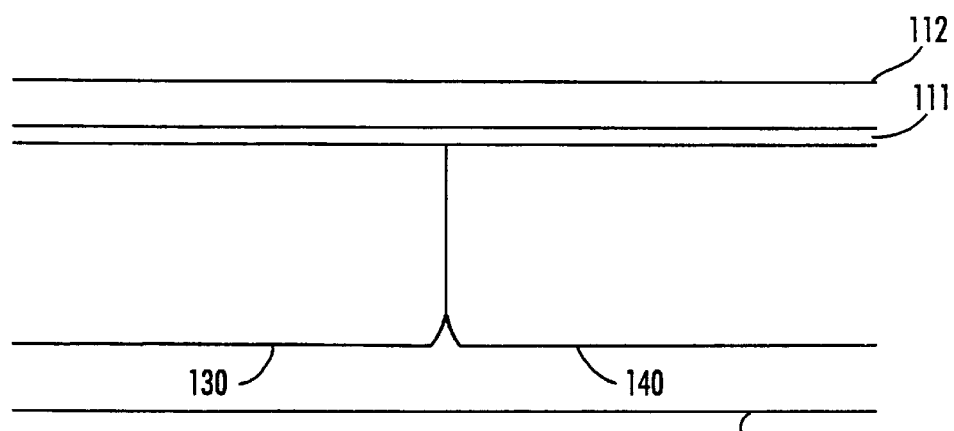
Figure 1C:
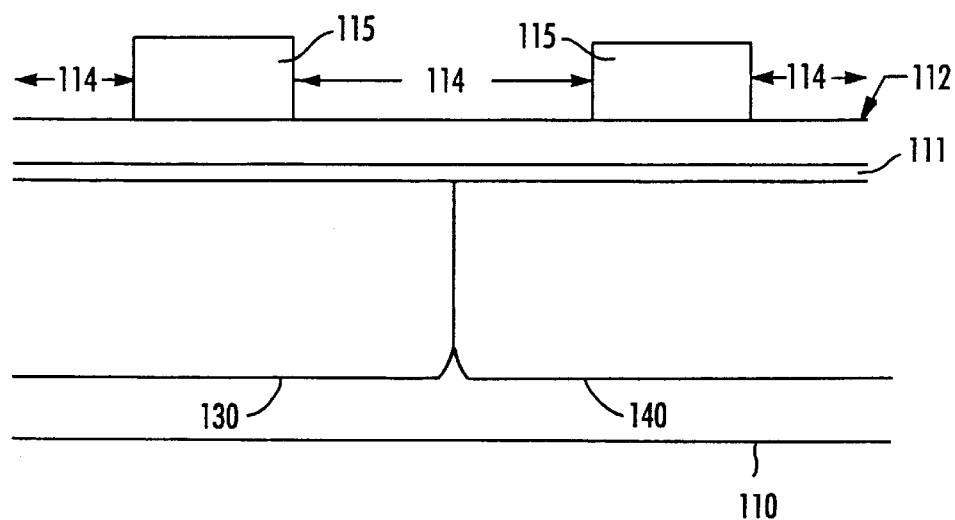
Figure 1D:
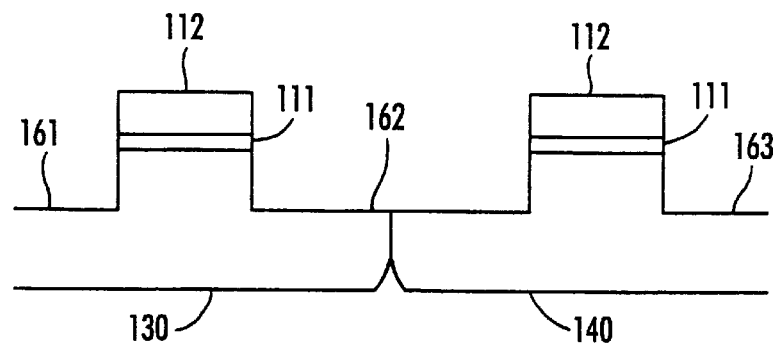
Figure 1E:
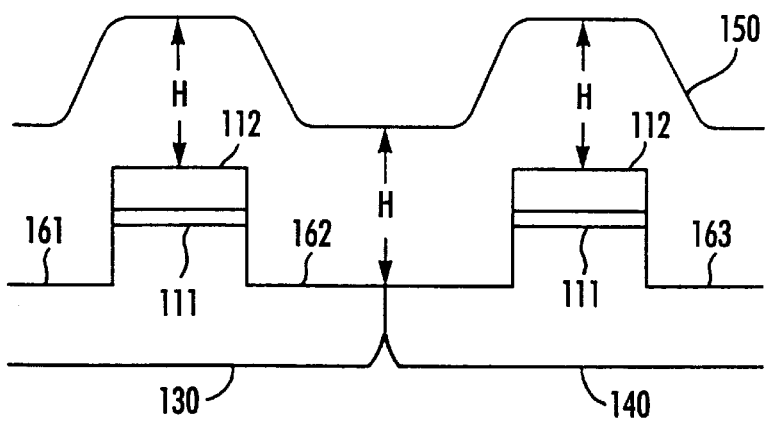
Figure 1F:
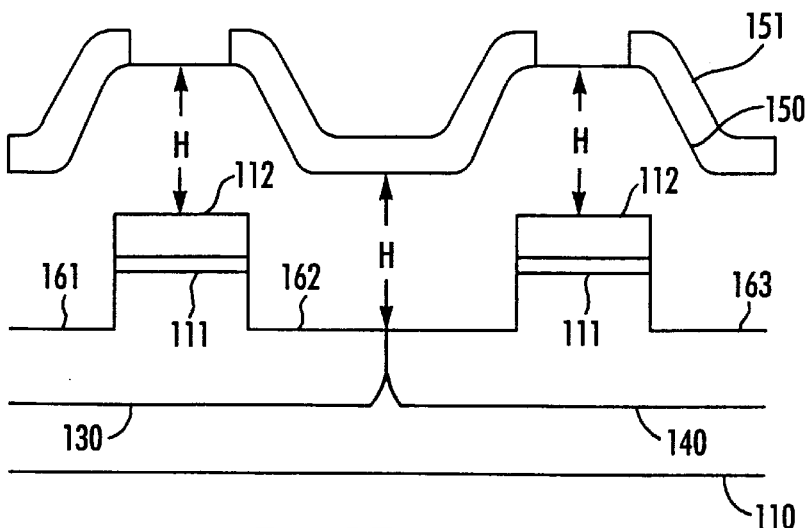
Figure 1G:
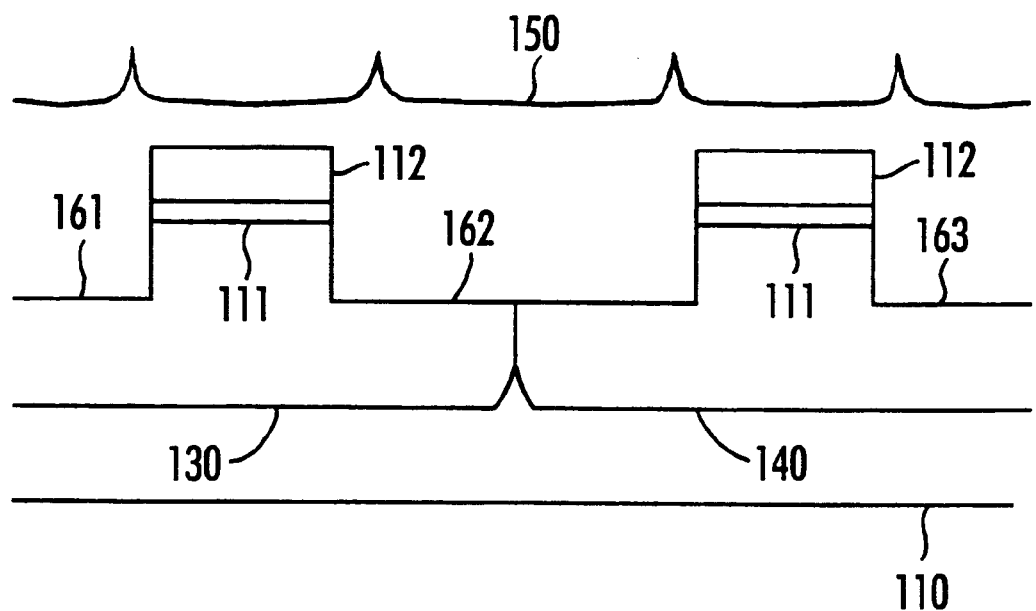
Figure 1H:
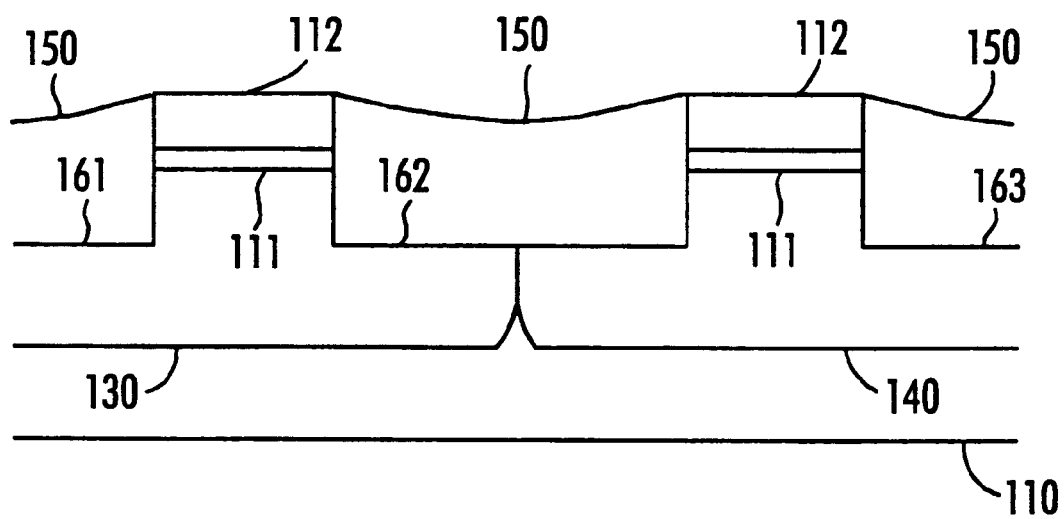
Figure 2A:
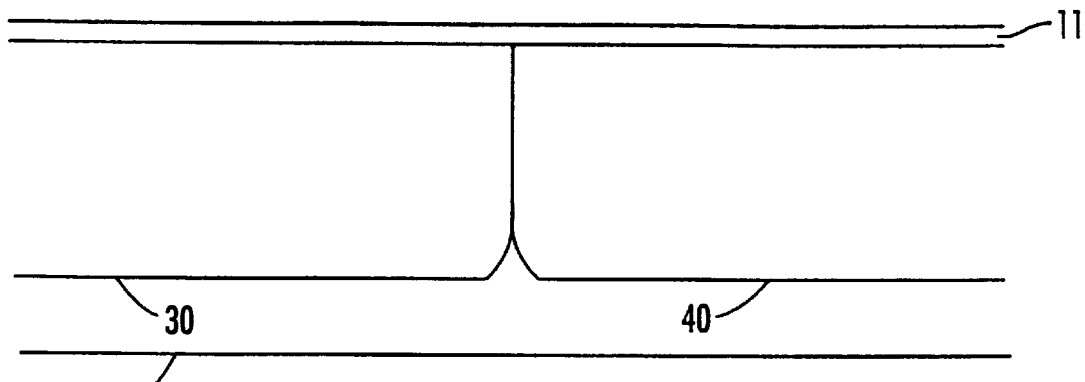
FIGS. 2A–2E illustrate an IC using narrow isolation trenches to minimize the dishing effect in conventional methods.
Figure 2B:
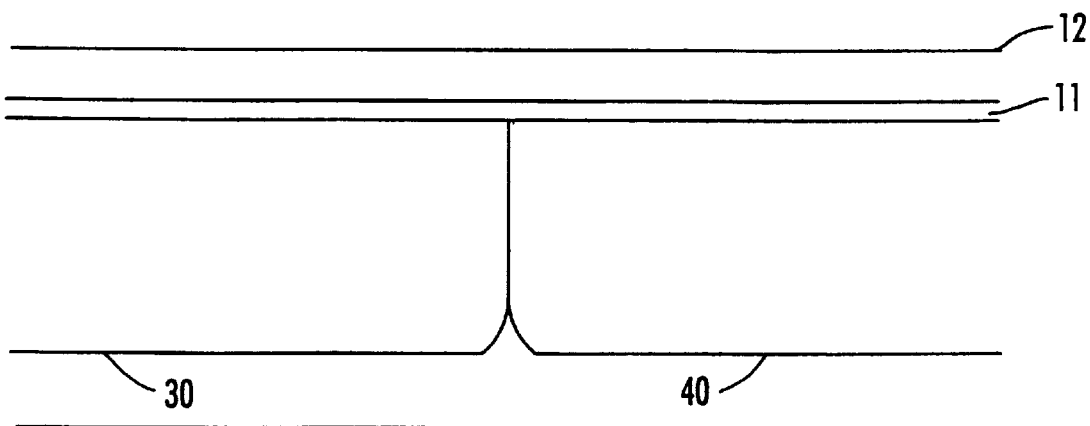
Figure 2C:
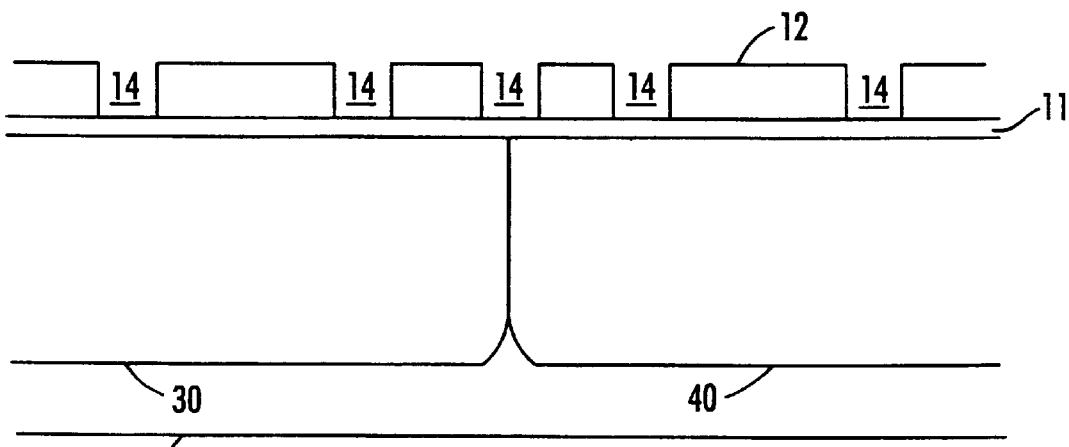
Figure 2D:
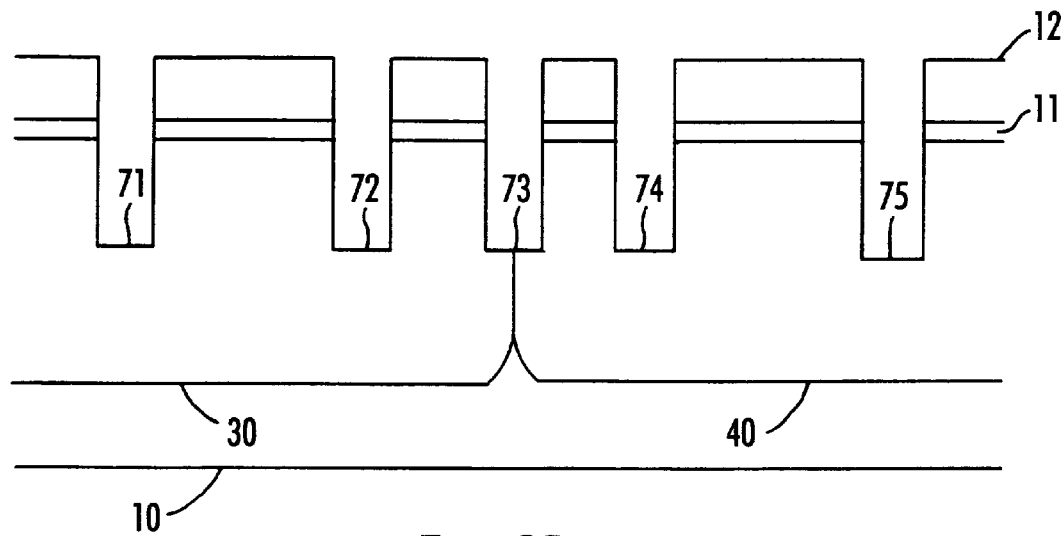
Figure 2E:
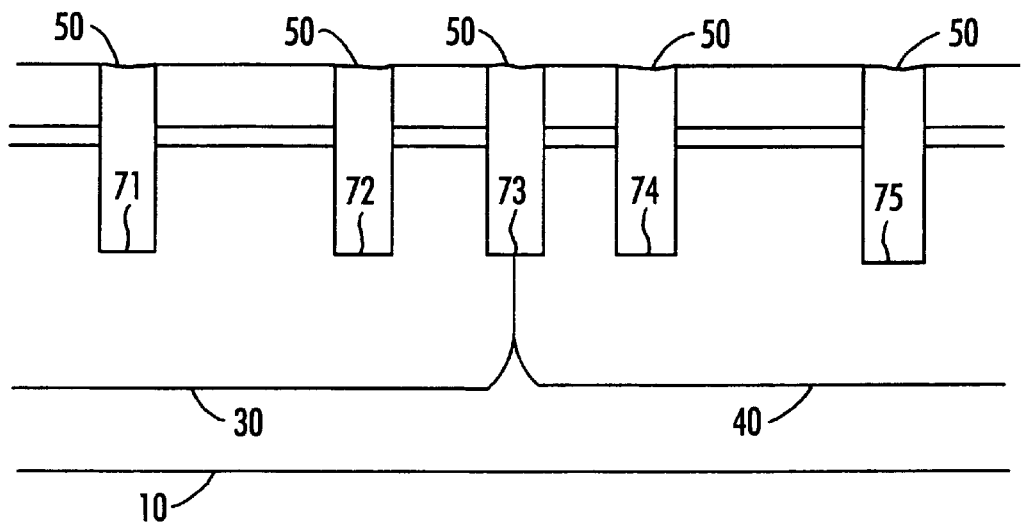
Figure 3A:
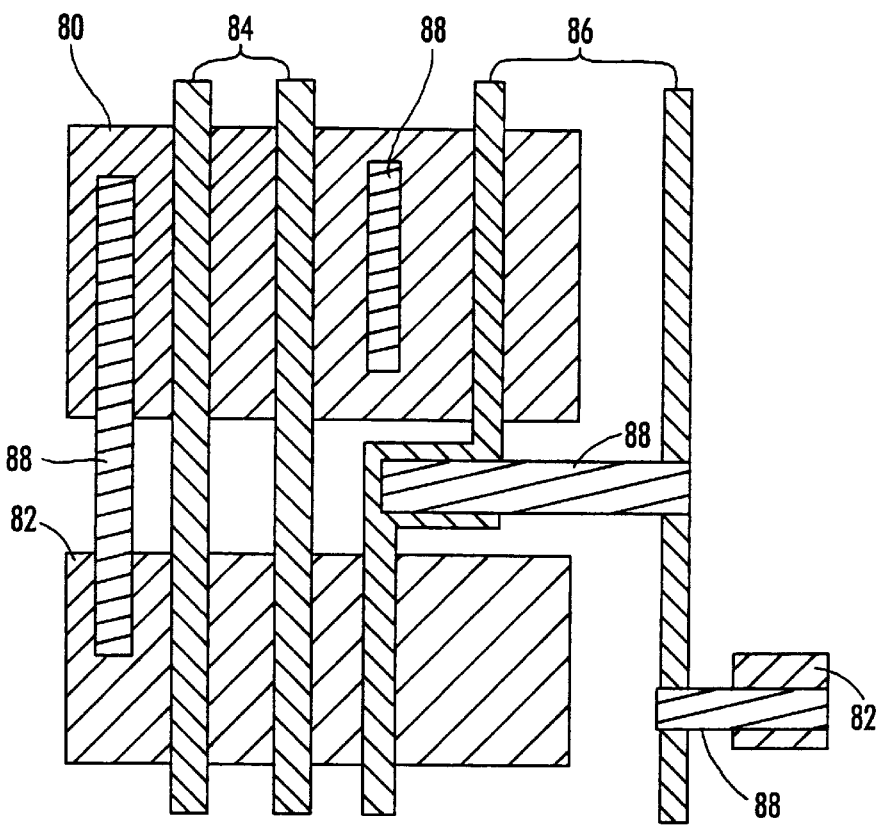
FIG. 3A is a bitmap representation (including grid lines) of data representing a layer having an active layer, polygatellayers and Local Interconnect layers.
Figure 4:
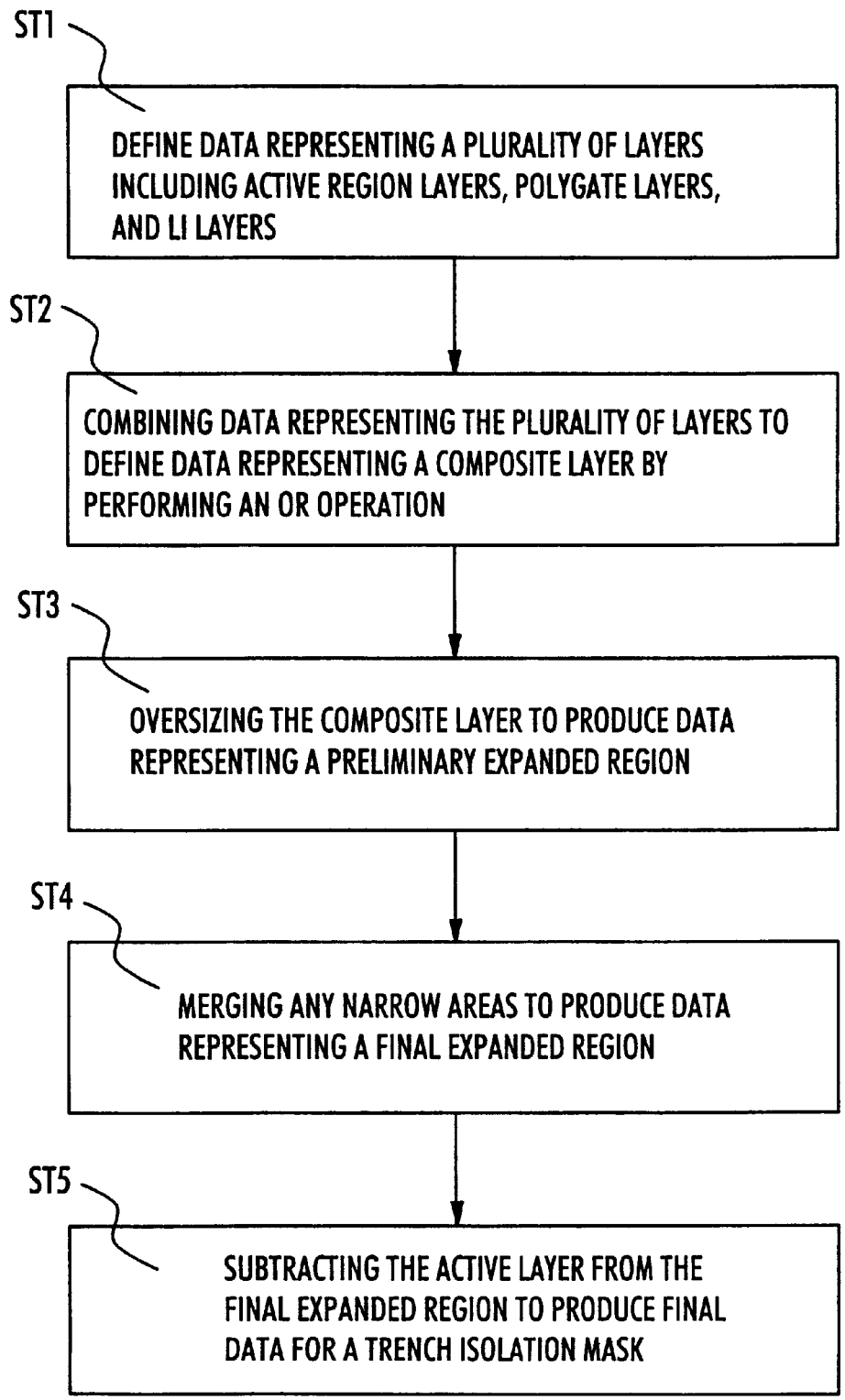
FIG. 4 is a flow diagram of a method of forming an isolation trench according to the present invention.

Refering to step 1 (ST1) in FIG. 4, in order to intelligently generate the photo-resist mask layer, the geometry data of active and other layers generated using a conventionally known computer aided design (CAD) system, such as IC Graph, manufactured by Mentor Graphics. FIG. 3A depicts an exemplary layout configuration as it would be configured and represented using a CAD system display interface. Generally speaking, a CAD system represents objects using bitmap or raster cells or pixels that are configured in rows and columns. Preferably, the cells are defined by the design rule for the semiconductor device, although this is not essential to the present invention. The present invention preferably uses a design rule of 0.25 $\mu$m, although other sized units can be used. Consequently, in the present invention, each cell is 0.25 $\mu$m in length by 0.25 $\mu$m in length.

In FIG. 3A, data representing a P active region 80 and an N active region 82 are defined as input into the computer. Additionally, data defining a pair of polygate layers 84 and 86, such as switching gates, and a Local Interconnect (LI) layer 88 that provides electrical connection of devices are defined.

Figure 3B:
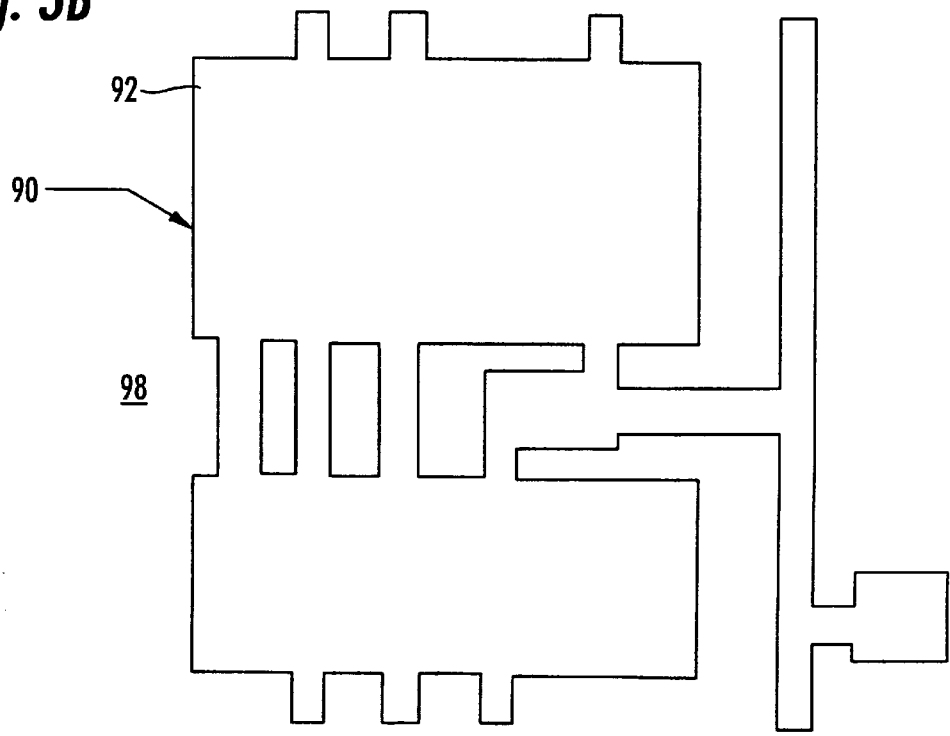
FIG. 3B is a bitmap representation of a composite layer output after an OR operation of the three layers in FIG. 3A.

Once data representing the three layers are defined, they are then combined in the computer to generate data representing a composite layer 90, as depicted in FIG. 3B. In step 2 (ST2) data representing the active, poly, and LI layers are combined using an OR logic operator to produce the composite layer 90, as depicted in the flow chart of FIG. 4. In one embodiment, the pattern data for the active layers 80 and 82, the polygate layers 84 and 86, and the LI layer 88 are defined in a bitmap, with a logical "1" representing a portion inside the mask, and a "0" representing a portion outside the mask.

These bitmaps are manipulated using logical OR operators to form a composite region 92 that defines the composite layer 90. The composite layer 90 includes both the polygate layers 84 and 86, and the LI layer 88, even when they are not on the active regions 80 and 82, because a trench must be formed about the perimeter of these layers in order to prevent a short circuit. It is readily apparent to one of ordinary skill in the art that a similar manipulation of data can be carried out using a vector-based system.

Figure 3C:
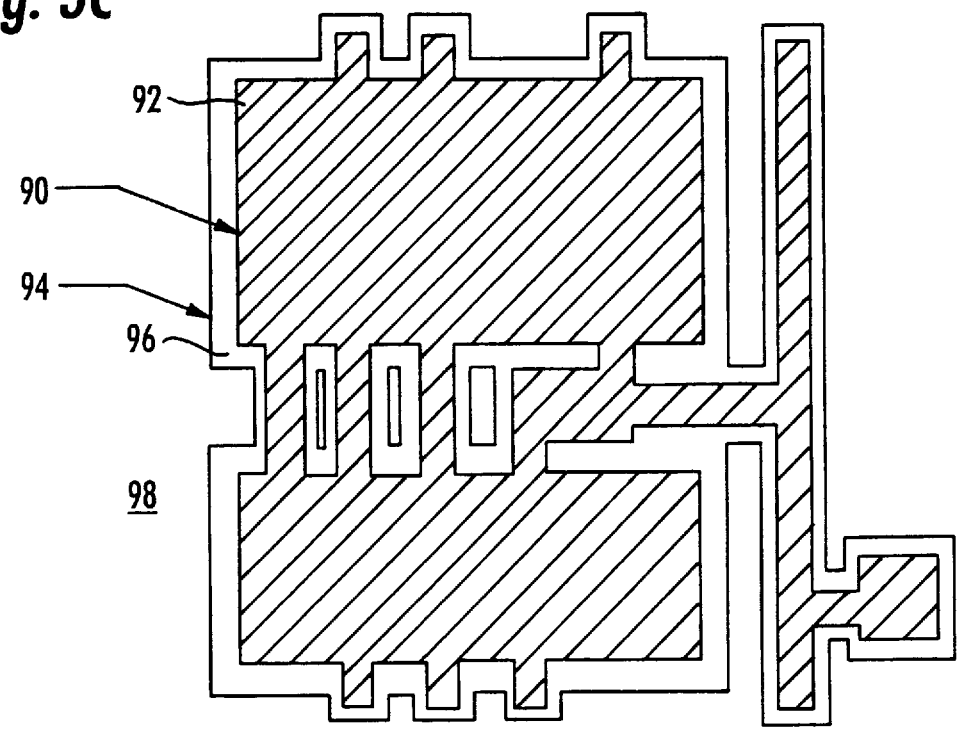
FIG. 3C is a bitmap representation of a preliminary expanded region produced by oversizing the data representing the composite layer from FIG. 3B.

Once data representing the composite layer 90 is determined, then in step 3 (ST3) the composite layer 90 is expanded, or oversized, evenly outward by the computer in all horizontal directions by a predetermined amount, λ, to define a preliminary expanded region 94, or preliminary trench isolation mask. When the predetermined amount, λ, is the design rule unit, the data representing the preliminary expanded region 94 is obtained by selecting or adding cells adjacent to those within the composite layer 90. Preferably the predetermined amount, λ, is between 0.2 μm and 0.5 μm. In the preferred embodiment the predetermined amount, λ, is defined as an integer multiple of the design rule unit, where the integer is greater than or equal to one. The resulting data representing the preliminary expanded region 94 is depicted in FIG. 3C.

Figure 3D:
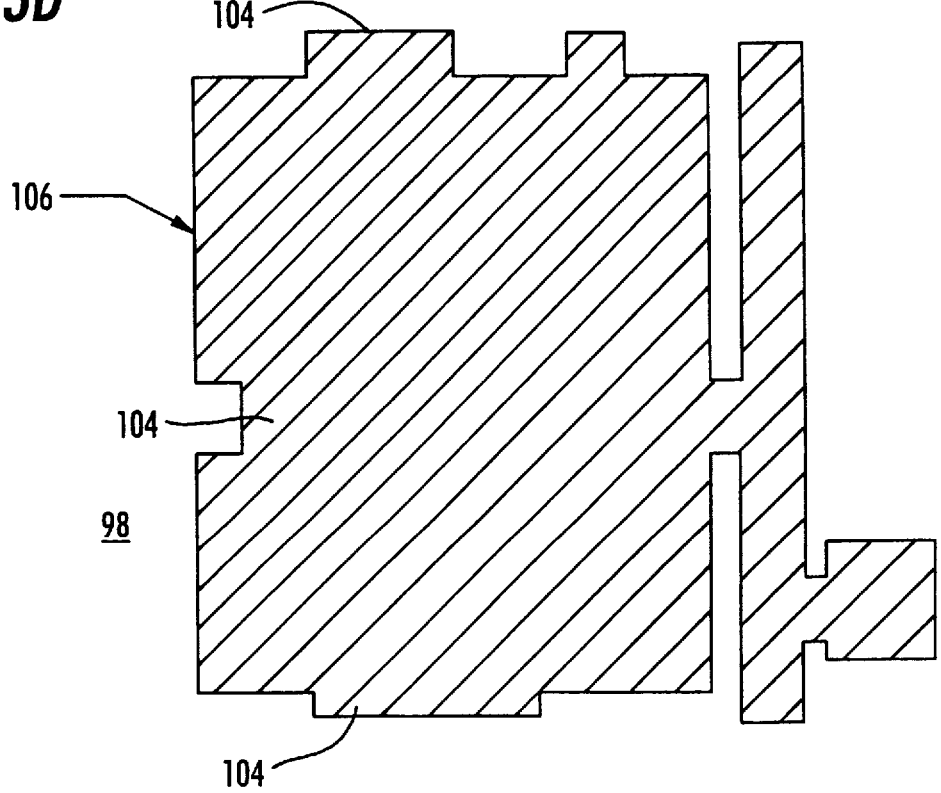
FIG. 3D is a bitmap representation of a final expanded region output after merging any narrow regions or small gaps with the preliminary expanded region from FIG. 3C.

At this point, it may be desirable to use step 4 (ST4) to merge any narrow areas 104 outside of the preliminary expanded region 94, thereby adding them to the data representing preliminary expanded region 94 to form data representing a final expanded region 106, as depicted in FIG. 3D.

Figure 3E:
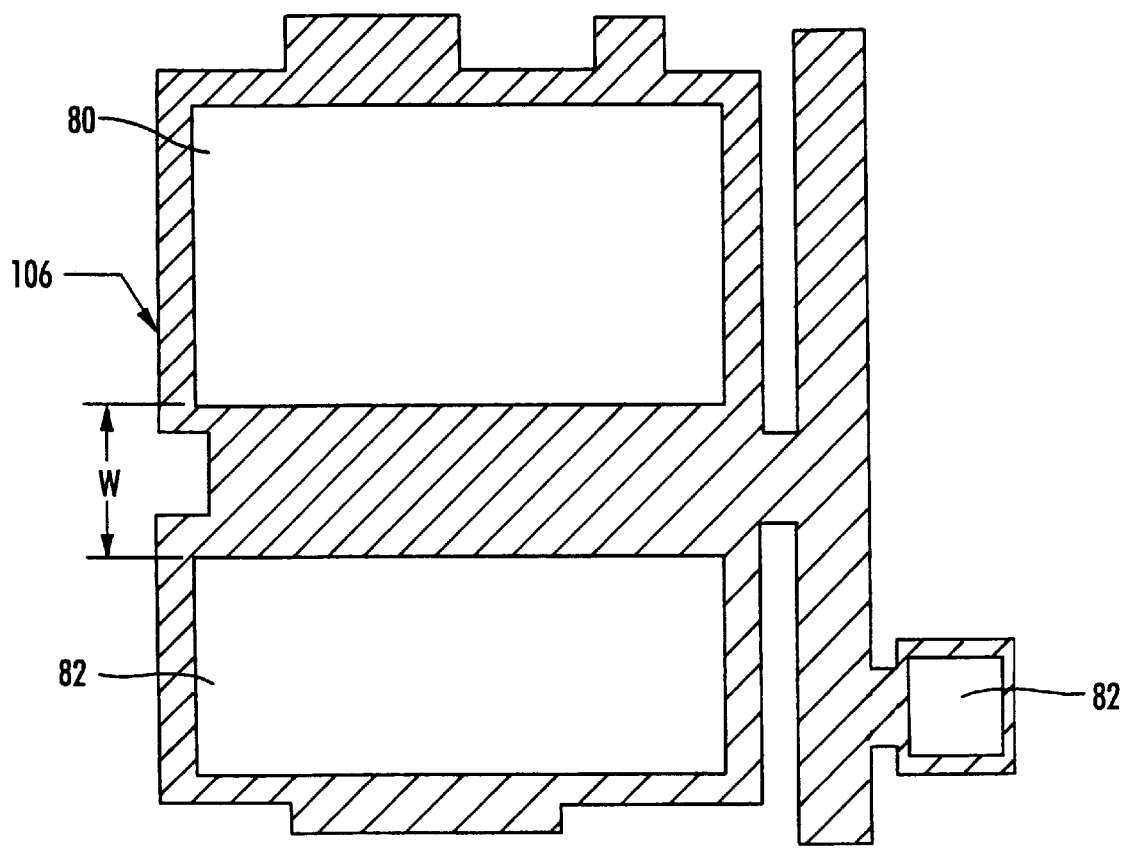
FIG. 3E is a bitmap representation of the final output after subtracting the original active layer from the data in FIG. 3D.

The next step is to subtract the original active layer (80, 82) from the data representing the final expanded region 106, as depicted in FIG. 3E. The final output data representing a region 96 may be generated by logic operation of the final expanded region 106. Data representing region 96 represents the trench isolation with limited trench width. The largest trench width W should be smaller than a predetermined value known to prevent dishing. It has been determined from experiments that no significant dishing is observed for a trench width as large as 2 μm. This number can be easily satisfied without applying special layout restrictions. This is especially true with the ever-shrinking trends in layout geometry.

Employing the photo-resist mask created as above, a narrow isolation trench is produced by etching through the nitride and the pad oxide layers to the semiconductor substrate. A high quality deposition oxide layer, preferably thermal oxide, is grown inside the narrow trench, followed by an oxide, preferably HDP (high-density plasma) or TEOS, deposited over the nitride layer and within the narrow isolation trench wherein the HDP oxide layer fills the narrow isolation trench. Then a portion of the HDP oxide layer is polished away, preferably by chemical-mechanical polishing stopping on the nitride layer. A conventional nitride strip in hot phosphoric completes the STI process.

The programming of the computer to perform the mask generation in accordance with the present invention, may be readily performed by one of ordinary skill in the art, given the flow chart of FIG. 4 and the above description.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor structure, comprising the machine-implemented steps of:

defining a plurality of layers for formation on a semiconductor substrate;

defining a composite layer of the plurality of layers;

expanding the composite layer by a predetermined distance to define an isolation trench mask pattern; and generating an isolation trench mask in accordance with the defined isolation trench mask pattern.

2. The method of claim 1 wherein the step of defining the composite layer of the plurality of layers is executed by a computer.

3. The method of claim 1 wherein the defined isolation trench mask pattern has an isolation trench with a width of less than or equal to about 2 μm.

4. The method of claim 1 wherein:

the plurality of layers comprise an active region layer and a polygate layer; and the step of defining a composite layer includes performing logical OR operators on the active region layer and the polygate layer.

5. The method of claim 1 wherein the defined isolation trench mask pattern has narrow areas between portions of the defined isolation trench mask pattern, and further comprising the step of merging the narrow areas to redefined the isolation trench mask pattern.

6. The method of claim 1 wherein the plurality of layers comprises an active region layer, a polygate layer, and a Local Interconnect layer.

7. The method of claim 6 wherein the step of defining a composite layer includes performing logical OR operators on the active region layer, the polygate layer, and the Local Interconnect layer.

8. A method of manufacturing a semiconductor structure including a semiconductor substrate having a pad oxide layer formed over the substrate, and a nitride layer formed over the pad oxide layer, the method comprising the machine-implemented steps of:

defining a plurality of layers for formation on a semiconductor substrate;

automatically defining a composite layer based on pattern data representing the plurality of layers;

automatically generating an isolation trench mask by oversizing the composite layer by a predetermined distance;

forming the isolation trench mask over the nitride layer;

etching an isolation trench in accordance with the isolation trench mask through the nitride and the pad oxide layers to the semiconductor substrate;

depositing an oxide layer over the nitride layer and within the isolation trench wherein the oxide layer fills the isolation trench; and polishing away a portion of the oxide layer to planarize the substrate.

9. The-method of claim 8 wherein the oxide layer is TEOS oxide.

10. The method of claim 8 wherein the polishing is a chemical-mechanical polishing.

11. The method of claim 8 wherein the step of defining the composite layer is executed by a computer.

12. The method of claim 8 wherein the isolation trench mask pattern has an isolation trench with a width of less than or equal to about 2 μm.

13. The method of claim 12 wherein:
the plurality of layers comprise an active region layer and a polygate layer; and
the step of defining a composite layer includes performing logical OR operators on the active region layer and the polygate layer.

14. The method of claim 8 further comprising the step of merging narrow areas between portions of the isolation trench mask.

15. The method of claim 8 wherein the plurality of layers comprises an active region layer, a polygate layer, and a Local Interconnect layer.

16. The method of claim 15 wherein the step of defining a composite layer include performing logical OR operators on the active region layer, the polygate layer, and the Local Interconnect layer.

* * * * *